United States Patent
Guo (10) Patent No.: US 6,528,376 B1
(45) Date of Patent: Mar. 4, 2003

(54) SACRIFICIAL SPACER LAYER METHOD FOR FABRICATING FIELD EFFECT TRANSISTOR (FET) DEVICE

(75) Inventor: Jyh-Chyurn Guo, Hsinchu (TW)

(73) Assignee: Taiwan Semiconductor Manufacturing Co., Ltd., Hsin Chu (TW)

( * ) Notice: Subject to any disclaimer, the term of this patent is extended or adjusted under 35 U.S.C. 154(b) by 0 days.

(21) Appl. No.: 09/998,626

(22) Filed: Nov. 30, 2001

(51) Int. Cl.[7] ............................................. H01L 21/336
(52) U.S. Cl. ........................ 438/302; 438/305; 438/307
(58) Field of Search ................................. 438/302, 305, 438/306, 307, 525

(56) References Cited

U.S. PATENT DOCUMENTS

| 5,468,665 A | 11/1995 | Lee et al. ................... 438/305 |
| 6,087,239 A | 7/2000 | Juengling ................... 438/305 |
| 6,127,234 A | 10/2000 | Gardner et al. ............. 438/305 |
| 6,153,455 A | 11/2000 | Ling et al. .................. 438/305 |
| 6,362,062 B1 * | 3/2002 | Nandakumar ............... 438/595 |

* cited by examiner

Primary Examiner—Chandra Chaudhari
(74) Attorney, Agent, or Firm—Tung & Associates (57) ABSTRACT

Within a method for fabricating a field effect transistor (FET) device within a microelectronic fabrication there is employed for forming a gate electrode from a blanket gate electrode material layer a self aligned two step patterning method. By employing the self aligned two step patterning method for forming the gate electrode, there may be formed within the field effect transistor (FET) device a source/drain region prior to forming interposed between the source/drain region and the gate electrode an additional ion implant structure while is formed while employing as a mask the gate electrode and a permanent spacer layer formed adjacent the gate electrode. By forming within the field effect transistor (FET) device the source/drain region prior to forming the additional ion implant structure, the additional ion implant structure is formed with enhanced structural stability, and thus the field effect transistor (FET) device is fabricated with enhanced performance.

15 Claims, 3 Drawing Sheets

SACRIFICIAL SPACER LAYER METHOD FOR FABRICATING FIELD EFFECT TRANSISTOR (FET) DEVICE

BACKGROUND OF THE INVENTION

1. Field of the Invention

The present invention relates generally to methods for fabricating field effect transistor (FET) devices within microelectronic fabrications. More particularly, the present invention relates to method for fabricating, with enhanced performance, field effect transistor (FET) devices within microelectronic fabrications.

2. Description of the Related Art

Microelectronic fabrications are formed from microelectronic substrates over which are formed patterned microelectronic conductor layers which are separated by microelectronic dielectric layers.

Indigenous within the fabrication of microelectronic fabrications, and particularly within the fabrication of semiconductor integrated circuit microelectronic fabrications, is the fabrication of field effect transistor (FET) devices within microelectronic fabrications, and in particular within semiconductor integrated circuit microelectronic fabrications.

Field effect transistor (FET) devices are desirable and indigenous within the art of microelectronic fabrication insofar as field effect transistor (FET) transistor devices are generally readily fabricated while employing in part self aligned methods which are in turn readily scalable when fabricating field effect transistor (FET) devices within microelectronic fabrications.

While field effect transistor (FET) devices are thus particularly desirable in the art of microelectronic fabrication and often essential in the art of microelectronic fabrication, field effect transistor (FET) devices are nonetheless not entirely without problems in the art of microelectronic fabrication, and in particular in the art of semiconductor integrated circuit microelectronic fabrication.

In that regard, as microelectronic fabrication integration levels have increased and microelectronic device and patterned microelectronic conductor layer dimensions have decreased, it has become increasingly difficult within the art of microelectronic fabrication to fabricate within microelectronic fabrications microelectronic devices, and in particular field effect transistor (FET) devices, with enhanced structural integrity, and thus enhanced performance.

It is thus desirable in the art of microelectronic fabrication to fabricate within microelectronic fabrications field effect transistor (FET) devices with enhanced structural integrity, and thus enhanced performance.

It is towards the foregoing object that the present invention is directed.

Various methods have been disclosed within the art of microelectronic fabrication, and in particular within the art of semiconductor integrated circuit microelectronic fabrication, for fabricating microelectronic devices, and in particular field effect transistor (FET) devices, with desirable properties in the art of microelectronic fabrication.

Included among the methods, but not limiting among the methods, are methods disclosed by: (1) Lee et al., in U.S. Pat. No. 5,468,665 (a method for forming within a field effect transistor (FET) device a lightly doped drain (LDD) low dose ion implant region adjacent a gate electrode within the field effect transistor (FET) device absent use of a spacer layer adjoining the gate electrode as a lightly doped drain (LDD) low dose ion implant mask, by instead employing a two step patterning method and two step ion implant method such that a source/drain region adjacent the gate electrode is formed prior to the lightly doped drain (LDD) low dose ion implant region adjacent the gate electrode); (2) Juengling, in U.S. Pat. No. 6,087,239 (a method for forming a field effect transistor (FET) device while employing as an ion implantation mask formed adjoining a gate electrode a sacrificial spacer layer formed of a readily etchable silicon-germanium alloy material); (3) Gardner et al., in U.S. Pat. No. 6,127,234 (another method for forming a field effect transistor (FET) device while employing as an ion implantation mask formed adjoining a gate electrode a sacrificial spacer layer formed of a readily etchable silicon-germanium alloy material); and (4) Ling et al., in U.S. Pat. No. 6,153,455 (a method for forming a field effect transistor (FET) device while employing as an ion implantation mask formed adjacent a gate electrode a sacrificial spacer layer formed of a silicon nitride material).

Desirable in the art of microelectronic fabrication, and in particular in the art of semiconductor integrated circuit microelectronic fabrication, are additional methods and materials which may be employed for forming, with enhanced structural integrity, field effect transistor (FET) devices within microelectronic fabrications.

It is towards the foregoing object that the present invention is directed.

SUMMARY OF THE INVENTION

A first object of the present invention is to provide a method for forming within a microelectronic fabrication a field effect transistor (FET) device.

A second object of the present invention is to provide a method in accord with the first object of the present invention, wherein the field effect transistor (FET) device is fabricated with enhanced structural integrity.

A third object of the present invention is to provide a method in accord with the first object of the present invention and the second object of the present invention, wherein the method is readily commercially implemented.

In accord with the objects of the present invention, there is provided by the present invention a method for fabricating a field effect transistor (FET) device.

To practice the method of the present invention, there is first provided a semiconductor substrate. There is then formed over the semiconductor substrate a blanket gate electrode material layer. There is then formed over the blanket gate electrode material layer a patterned auxiliary layer. There is then formed adjacent a sidewall of the patterned auxiliary layer and also over the blanket gate electrode material layer a sacrificial spacer layer. There is then etched, while employing at least the patterned auxiliary layer and the sacrificial spacer layer as a mask, the blanket gate electrode material layer to form a once patterned gate electrode material layer. There is then implanted, while employing at least the once patterned gate electrode material layer as a mask, a source/drain region within the semiconductor substrate. There is also stripped from adjacent the sidewall of the patterned auxiliary layer the sacrificial spacer layer. There is then etched, while employing the patterned auxiliary layer but not the sacrificial spacer layer as a mask, the once patterned gate electrode material layer to form a gate electrode. There is then formed adjacent a sidewall of the gate electrode a permanent spacer layer. Finally, there is then implanted, while employing at least the gate electrode and the permanent spacer layer as a mask, at least one additional ion implant structure within the semiconductor substrate.

There is provided by the present invention a method for fabricating within a microelectronic fabrication a field effect transistor (FET) device, wherein the field effect transistor (FET) device is fabricated with enhanced structural integrity.

The present invention realizes the foregoing object by employing when fabricating the field effect transistor (FET) device in accord with the present invention a two step etching method for forming from a blanket gate electrode material layer a gate electrode employed within the field effect transistor (FET) device. By employing the two step etching method for forming from the blanket gate electrode material layer the gate electrode employed within the field effect transistor (FET) device, a source/drain region within the field effect transistor (FET) device may be formed prior to forming an additional ion implant structure within the field effect transistor (FET) device (such as but not limited to an additional lightly doped drain (LDD) low dose ion implant structure within the field effect transistor (FET) device or an additional pocket ion implant structure within the field effect transistor (FET) device), such that the additional ion implant structure which is formed within the field effect transistor (FET) device while employing the gate electrode and a permanent spacer formed adjacent thereto as an ion implant mask need not be exposed to a thermal annealing processing employed for thermal annealing processing of the source/drain region within the field effect transistor (FET) device. Thus, the structural integrity of the additional ion implant structure employed within the field effect transistor is enhanced, and consequently also the performance of the field effect transistor (FET) device is enhanced.

The method of the present invention is readily commercially implemented.

The present invention employs methods and materials as are generally known in the art of microelectronic fabrication, and in particular in the art of semiconductor integrated circuit microelectronic fabrication, but employed within the context of a specific ordering and specific process limitations to provide the present invention. Since it is thus a specific ordering and specific process limitations which provide at least in part the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiment, as set forth below.

The Description of the Preferred Embodiment is understood within the context of the accompanying drawings, which form a material part of this disclosure, wherein.

DESCRIPTION OF THE PREFERRED EMBODIMENT

The present invention provides a method for fabricating within a microelectronic fabrication a field effect transistor (FET) device, wherein the field effect transistor (FET) device is fabricated with enhanced structural integrity.

The present invention realizes the foregoing object by employing when fabricating the field effect transistor (FET) device in accord with the present invention a two step etching method for forming from a blanket gate electrode material layer a gate electrode employed within the field effect transistor (FET) device. By employing the two step etching method for forming from the blanket gate electrode material layer the gate electrode employed within the field effect transistor (FET) device, a source/drain region within the field effect transistor (FET) device may be formed prior to forming an additional ion implant structure within the field effect transistor (FET) device (such as but not limited to an additional lightly doped drain (LDD) low dose ion implant structure within the field effect transistor (FET) device or an additional pocket ion implant structure within the field effect transistor (FET) device), such that the additional ion implant structure which is formed within the field effect transistor (FET) device while employing the gate electrode and a permanent spacer formed adjacent thereto as an ion implant mask need not be exposed to a thermal annealing processing employed for thermal annealing processing of the source/drain region within the field effect transistor (FET) device. Thus, the structural integrity of the additional ion implant structure employed within the field effect transistor is enhanced, and consequently also the performance of the field effect transistor (FET) device is enhanced.

Although the preferred embodiment of the present invention illustrates the present invention within the context of forming within a semiconductor integrated circuit microelectronic fabrication, and in accord with a preferred embodiment of the present invention, a field effect transistor (FET) device, within the context of appropriate thin film field effect transistor (FET) device fabrication methods, the present invention may be employed for fabricating, with enhanced structural integrity, field effect transistor (FET) devices within microelectronic fabrications including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications. Under such circumstances, a semiconductor layer within the microelectronic fabrication within and upon which is fabricated a field effect transistor (FET) device is intended to represent a "semiconductor substrate" within the context of the claimed invention.

Similarly, although the preferred embodiment of the present invention illustrates the present invention within the context of fabricating a metal oxide semiconductor field effect transistor (MOSFET) device within a semiconductor integrated circuit microelectronic fabrication, the present invention may be employed for forming field effect transistor (FET) devices including but not limited to metal oxide semiconductor field effect transistor (MOSFET) devices and metal semiconductor field effect transistor (MESFET) devices within various of the foregoing microelectronic fabrications which employ as a semiconductor substrate a silicon semiconductor material or an other semiconductor material, such as a compound semiconductor material.

Figure 1:
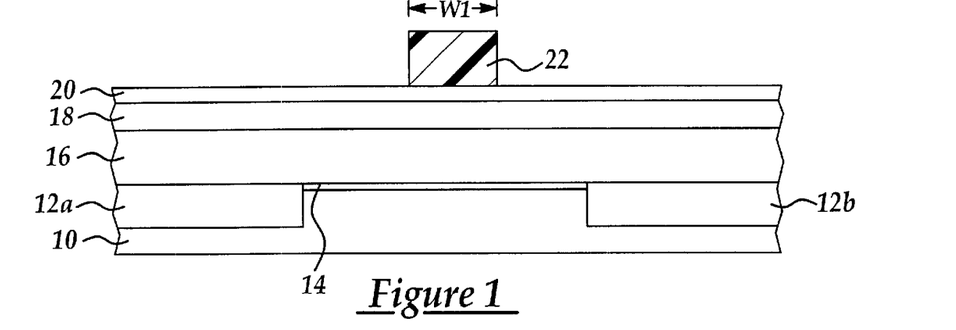
FIG. 1, FIG. 2, FIG. 3, FIG. 4, FIG. 5, FIG. 6, FIG. 7, FIG. 8, FIG. 9 and FIG. 10 shown a series of schematic cross-sectional diagrams illustrating the results of progressive stages in forming within a semiconductor integrated circuit microelectronic fabrication, and in accord with a preferred embodiment of the present invention, a field effect transistor (FET) device within the semiconductor integrated circuit microelectronic fabrication.

Referring now to FIG. 1 to FIG. 10, there is shown a series of schematic cross-sectional diagrams illustrating the results of progressive stages in fabricating within a semiconductor integrated circuit microelectronic fabrication, and in accord with a preferred embodiment of the present invention, a field effect transistor (FET) device within the semiconductor integrated circuit Shown in FIG. 1 is a schematic cross-sectional diagram of the semiconductor integrated circuit microelectronic fabrication at an early stage in its fabrication in accord with the preferred embodiment of the present invention.

Shown in FIG. 1, in a first instance, is a semiconductor substrate 10 having formed therein a pair of isolation regions 12a and 12b which define an active region of the semiconductor substrate 10.

Within the preferred embodiment of the present invention with respect to the semiconductor substrate 10, and although it is known in the art of semiconductor integrated circuit microelectronic fabrication that semiconductor substrates are available with either dopant polarity, various dopant concentrations and several crystallographic orientations, for the preferred embodiment of the present invention, the semiconductor substrate 10 is typically and preferably a (100) silicon semiconductor substrate having an N- or P-doping.

Similarly, within the preferred embodiment of the present invention with respect to the pair of isolation regions 12a and 12b, and although it is known in the art of semiconductor integrated circuit microelectronic fabrication that isolation regions may be formed employing methods including but not limited to isolation region thermal growth methods and isolation region deposition/patterning methods, for the preferred embodiment of the present invention the pair of isolation regions 12a and 12b is typically and preferably formed within and upon the semiconductor substrate 10 to define the active region of the semiconductor substrate 10 while employing a shallow trench isolation (STI) region thermal grow method and deposition/patterning method to provide the active region of the semiconductor substrate 10 of bidirectional areal linewidth from about 0.6 to about 10 microns surrounded by a bidirectional array of isolation regions including the pair of isolation regions 12a and 12b.

Shown also within the schematic cross-sectional diagram of FIG. 1 formed upon the active region of the semiconductor substrate and also bounded by the pair of isolation regions 12a and 12b is a gate dielectric layer 14.

Within the preferred embodiment of the present invention with respect to the gate dielectric layer 14, and although it is known in the art of semiconductor integrated circuit microelectronic fabrication that gate dielectric layers may be formed employing methods including but not limited to gate dielectric layer thermal growth methods and gate dielectric layer deposition/patterning methods, for the preferred embodiment of the present invention, the gate dielectric layer 14 is typically and preferably formed employing a gate dielectric layer thermal growth method to form the gate dielectric layer 14 of silicon oxide of thickness from about 15 to about 50 angstroms formed upon the active region of the semiconductor substrate 10.

Shown also within the schematic cross-sectional diagram of FIG. 1 formed upon or over the pair of isolation regions 12a and 12b and the gate dielectric layer 14 is a series of three blanket layer comprising: (1) a blanket gate electrode material layer 16 formed upon the pair of isolation regions 12a and 12b and the gate dielectric layer 14; (2) a blanket auxiliary layer 18 formed upon the blanket gate electrode material layer 16; and (3) a blanket anti-reflective coating (ARC) layer 20 formed upon the blanket auxiliary layer 18. Finally, there is also shown within the schematic cross-sectional diagram of FIG. 1 a patterned photoresist layer 22 formed upon the blanket anti-reflective coating (ARC) layer 20 and nominally centered above the active region of the semiconductor substrate 10.

Within the preferred embodiment of the present invention with respect to the blanket gate electrode material layer 16, the blanket gate electrode material layer 16 may be formed of gate electrode materials as are conventional in the art of semiconductor integrated circuit microelectronic fabrication, including but not limited to metal, metal alloy, doped polysilicon (having a dopant concentration of greater than about 1E19 dopant atoms per cubic centimeter) and polycide (doped polysilicon/metal silicide stack) gate electrode materials. Typically and preferably the blanket gate electrode material layer 16 is formed at least in part of a doped polysilicon gate electrode material formed to a thickness of from about 1000 to about 2500 angstroms.

Within the preferred embodiment of the present invention with respect to the blanket auxiliary layer 18, the blanket auxiliary layer is formed of a microelectronic material which in a first instance serves as a hard mask etch mask material when etching the blanket gate electrode material layer to form a patterned gate electrode material layer therefrom. Similarly, although the blanket auxiliary layer 18 may thus be formed of microelectronic materials including but not limited to microelectronic conductor materials, microelectronic semiconductor materials and microelectronic dielectric materials, for the preferred embodiment of the present invention, for illustrative purposes, and without limitation, the blanket auxiliary layer 18 is typically and preferably formed of a microelectronic dielectric material and more typically and preferably formed of a silicon oxide microelectronic dielectric material, formed to a thickness of from about 400 to about 800 angstroms upon the blanket gate electrode material layer 16.

Within the preferred embodiment of the present invention with respect to the blanket anti-reflective coating (ARC) layer 20, the blanket anti-reflective coating (ARC) layer 20 may be formed of anti-reflective coating (ARC) materials as are conventional in the art of semiconductor integrated circuit microelectronic fabrication, including but not limited to organic anti-reflective coating (ARC) materials and inorganic anti-reflective coating (ARC) materials. Typically and preferably the blanket anti-reflective coating (ARC) layer 20 is formed to a thickness of from about 600 to about 800 angstroms upon the blanket auxiliary layer 18. As is understood by a person skilled in the art, the blanket anti-reflective coating (ARC) layer 20 provides attenuated reflective photoexposure of a blanket photoresist layer from which is formed the patterned photoresist layer 22 as illustrated within the schematic cross-sectional diagram of FIG. 1.

Finally, within the preferred embodiment of the present invention with respect to the patterned photoresist layer 22, and although it is known in the art of semiconductor integrated circuit microelectronic fabrications that photoresist layers may be formed from photoresist materials including but not limited to positive photoresist materials and negative photoresist materials, for the preferred embodiment of the present invention the patterned photoresist layer 22 is typically and preferably formed of a positive photoresist material, in order to assure optimal dimensional stability. Typically and preferably, the patterned photoresist layer 22 is formed to a thickness of from about 3000 to about 5000 angstroms upon the blanket anti-reflective coating (ARC) layer 20, and of a linewidth W1 from about 0.1 to about 10 microns nominally centered over the active region of the semiconductor substrate 10 as illustrated within the schematic cross-sectional diagram of FIG. 1.

Figure 2:
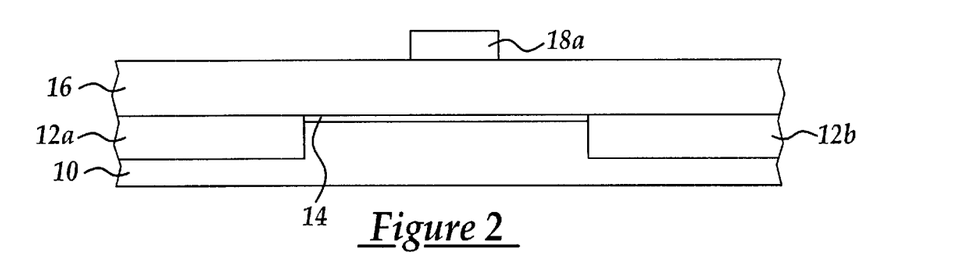

Referring now to FIG. 2, there is shown a schematic cross-sectional diagram illustrating the results of further processing of the semiconductor integrated circuit microelectronic fabrication whose schematic cross-sectional diagram is illustrated in FIG. 1.

Shown in FIG. 2 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 1, but wherein, in a first instance, both the blanket anti-reflective coating (ARC) layer 20 and the blanket auxiliary layer 18 have been patterned, while employing the patterned photoresist layer 22 as a mask, to form a corresponding patterned anti-reflective coating (ARC) layer (not shown) and a corresponding patterned auxiliary layer 18a.

Within the preferred embodiment of the present invention, the blanket anti-reflective coating (ARC) layer 20 and the blanket auxiliary layer 18 may be patterned to form the corresponding patterned anti-reflective coating (ARC) layer (not shown) and corresponding patterned auxiliary layer 18a while employing an etchant, or a series of etchants, preferably of anisotropic etching character, as are appropriate for etching the anti-reflective coating (ARC) material from which is formed the blanket anti-reflective coating (ARC) layer 20 and a microelectronic material from which is formed the blanket auxiliary layer 18.

Shown also within the schematic cross-sectional diagram of FIG. 2, in absence, is the patterned photoresist layer 22 and the patterned anti-reflective coating (ARC) layer (not shown), which have been stripped from over or upon the patterned auxiliary layer 18a when forming from the semiconductor integrated circuit microelectronic fabrication whose schematic cross-sectional diagram is illustrated in FIG. 1 the semiconductor integrated circuit microelectronic fabrication whose schematic cross-sectional diagram is illustrated in FIG. 2.

The patterned photoresist layer 22 and the patterned anti-reflective coating (ARC) layer (not shown), may be stripped from over or upon the patterned auxiliary layer 18a to provide in part from the semiconductor integrated circuit microelectronic fabrication whose schematic cross-sectional diagram is illustrated in FIG. 1 the semiconductor integrated circuit microelectronic fabrication whose schematic cross-sectional diagram is illustrated in FIG. 2 while employing stripping methods and materials as are otherwise conventional in the art of semiconductor integrated circuit microelectronic fabrication. Similarly, and as is understood by a person skilled in the art, given an appropriate material of composition of the patterned anti-reflective coating (ARC) layer (not shown), the patterned anti-reflective coating (ARC) layer (not shown) need not necessarily be stripped from upon the patterned auxiliary layer 18a, although for clarity such is illustrated within the preferred embodiment of the present invention.

Figure 3:
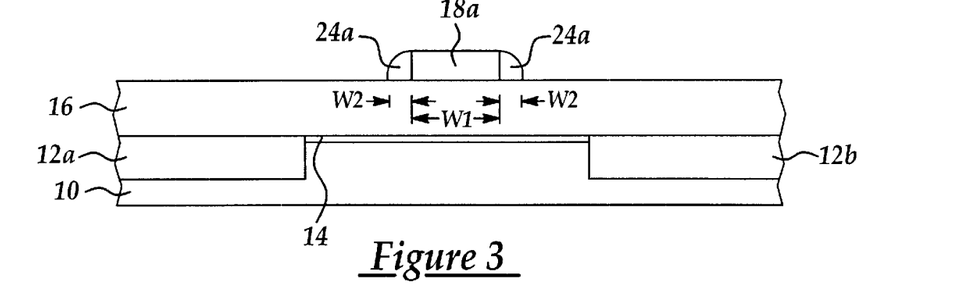

Referring now to FIG. 3, there is shown a schematic cross-sectional diagram illustrating the results of further processing of the semiconductor integrated circuit microelectronic fabrication whose schematic cross-sectional diagram is illustrated in FIG. 2.

Shown in FIG. 3 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 2, but wherein there is formed adjacent and adjoining a pair of opposite sidewalls of the patterned auxiliary layer 18a and also over and upon the blanket gate electrode material layer 16 a pair of sacrificial spacer layers 24a and 24b.

Within the preferred embodiment of the present invention with respect to the pair of sacrificial spacer layers 24a and 24b, the pair of sacrificial spacer layers 24a and 24b may be formed employing a blanket conformal layer deposition method and anisotropic etchback method as is otherwise generally conventional in the art of microelectronic fabrication, and in particular in the art of semiconductor integrated circuit microelectronic fabrication. Similarly, and in accord with the present invention, the pair of sacrificial spacer layers 24a and 24b need of necessity be formed of a material such that: (1) the blanket gate electrode material layer 16 may be etched selectively with respect to the patterned auxiliary layer 18a and the pair of sacrificial spacer layers 24a and 24b; and (2) the pair of sacrificial spacer layers 24a and 24b may subsequently be etched selectively with respect to the patterned auxiliary layer 18a and a once patterned gate electrode material layer formed from the blanket gate electrode material layer 16. Thus, although the pair of sacrificial spacer layers 24a and 24b may be formed of microelectronic materials including but not limited to microelectronic conductor materials, microelectronic semiconductor materials and microelectronic dielectric materials, for the preferred embodiment of the present invention when the blanket gate electrode material layer 16 is preferably formed at least in part of a doped polysilicon gate electrode material and the patterned auxiliary layer 18a is preferably formed of a silicon oxide dielectric material, for example, and without limitation, the pair of sacrificial spacer layers 24a and 24b is preferably formed of a silicon nitride dielectric material. Typically and preferably, each of the pair of sacrificial spacer layers 24a and 24b has a linewidth W2 adjacent and preferably adjoining a sidewall of the patterned auxiliary layer 18a of from about 0.04 to about 0.1 microns, as illustrated within FIG. 3. Similarly, each of the sacrificial spacer layers 24a and 24b is formed to a thickness, at its point, equivalent to the thickness of the patterned auxiliary layer 18a.

Figure 4:
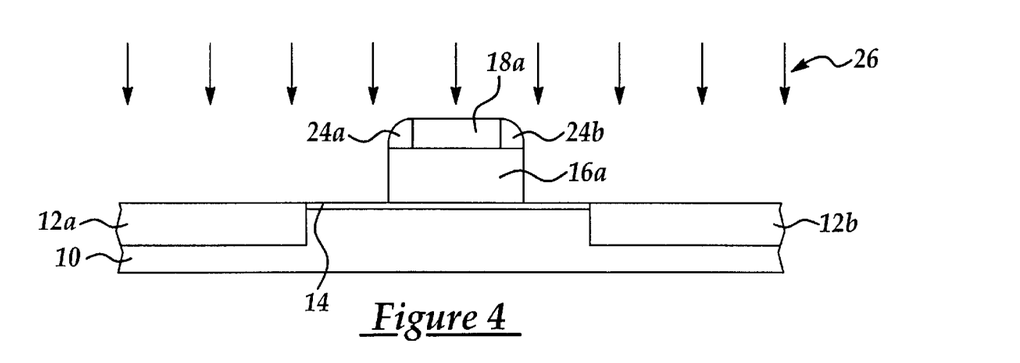

Referring now to FIG. 4, there is shown a schematic cross-sectional diagram illustrating the results of further processing of the semiconductor integrated circuit microelectronic fabrication whose schematic cross-sectional diagram is illustrated in FIG. 3.

Shown in FIG. 4 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 3, but wherein the blanket gate electrode material layer 16 has been patterned to form a once patterned gate electrode material layer 16a, while employing the patterned auxiliary layer 18a and the pair of sacrificial spacer layers 24a and 24b as a mask, in conjunction with a first etching plasma 26.

Within the preferred embodiment of the present invention with respect to the first etching plasma 26, the first etching plasma 26 typically and preferably employs methods and materials as are appropriate for selectively etching the gate electrode material from which is formed the blanket gate electrode material layer 16 with respect to the microelectronic material from which is formed the pair of sacrificial spacer layers 24a and 24b and the microelectronic material from which is formed the patterned auxiliary layer 18a, which within the context of the preferred embodiment of the present invention when the blanket gate electrode material layer 16 is formed at least in part of a doped polysilicon gate electrode material, the pair of sacrificial spacer layers 24a and 24b is formed of a silicon nitride dielectric material and the patterned auxiliary layer 18a is formed of a silicon oxide dielectric material will employ a chlorine containing etchant gas composition.

Figure 5:
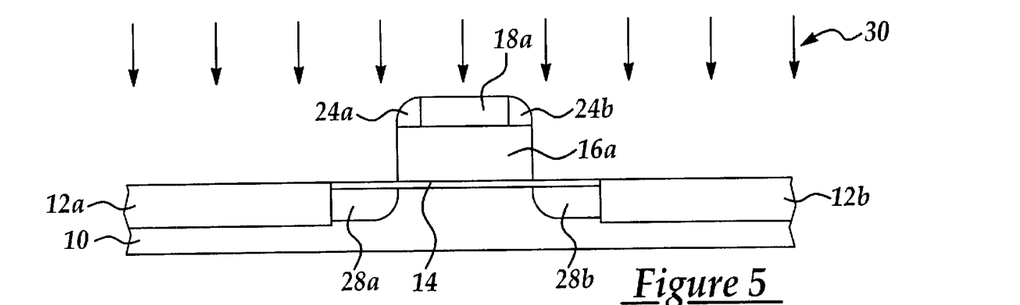

Referring now to FIG. 5, there is shown a schematic cross-sectional diagram illustrating the results of further processing of the semiconductor integrated circuit microelectronic fabrication whose schematic cross-sectional diagram is illustrated in FIG. 4.

Shown in FIG. 5 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 4, but wherein there has been implanted into the active region of the semiconductor substrate 10 a pair of source/drain regions 28a and 28b while employing the once patterned gate electrode material layer 16a, the patterned auxiliary layer 18a and the pair of sacrificial spacer layers 24a and 24b as a mask (or alternatively at least the once patterned gate electrode material layer 16a as a mask), in conjunction with a dose of first implanting ions 30.

Within the preferred embodiment of the present invention with respect to the dose of first implanting ions 30, the dose of first implanting ions 30 is typically and preferably provided of polarity opposite the polarity of the semiconductor substrate 10 and also provided at a comparatively high dose of from about 3E15 to about 8E15 dopant ions per square centimeter and an ion implantation energy of from about 10 to about 20 kev for phosphorus and from about 20 kev to about 60 kev for arsenic for NMOS, and from about 5 to about 10 kev for boron for PMOS, to form the pair of source/drain regions 28a and 28b which is typically and preferably thermally annealed at a temperature of from about 900 to about 1075 degrees centigrade for a time period of from about 0.5 to about 0 minutes to repair any ion implant damage to the active region of the semiconductor substrate 10 prior to further processing of the semiconductor integrated circuit microelectronic fabrication whose schematic cross-sectional diagram is illustrated in FIG. 5.

Figure 6:
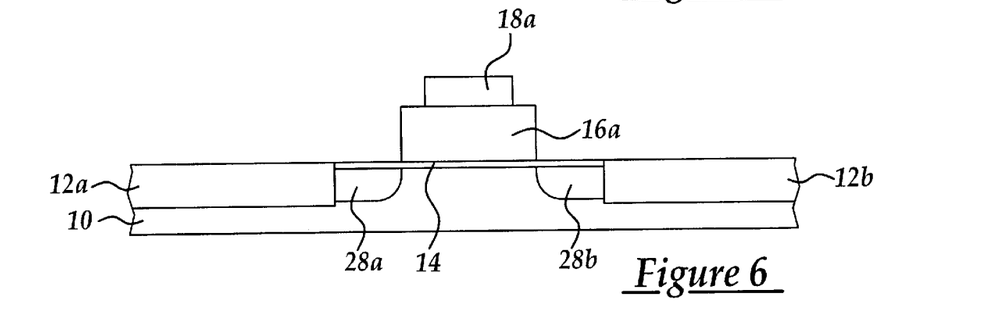

Referring now to FIG. 6, there is shown a schematic cross-sectional diagram illustrating the results of further processing of the semiconductor integrated circuit microelectronic fabrication whose schematic cross-sectional diagram is illustrated in FIG. 5.

Shown in FIG. 6 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 5, but wherein there has been stripped from adjacent and adjoining the sidewalls of the patterned auxiliary layer the pair of sacrificial spacer layers 24a and 24b.

Within the preferred embodiment of the present invention, the pair of sacrificial spacer layers 24a and 24b may be stripped from adjacent and adjoining the sidewalls of the patterned auxiliary layer 18a while employing methods and materials as are conventional in the art of microelectronic fabrication, and in particular in the art of semiconductor integrated circuit microelectronic fabrication, and as are similarly appropriate for etching the microelectronic material from which is formed the pair of sacrificial spacer layers 24a and 24b (which may in the alternative have been stripped prior to forming the source/drain regions 28a and 28b while employing the dose of first dopant ions 30 as illustrated within the schematic cross-sectional diagram of FIG. 5). Within the preferred embodiment of the present invention when the pair of sacrificial spacer layers 24a and 24b is formed of a silicon nitride dielectric material, the pair of patterned sacrificial spacer layers 24 and 24b may be selectively stripped from adjacent and adjoining the pair of sidewalls of the patterned auxiliary layer 18a as illustrated in FIG. 5 to provide the semiconductor integrated circuit microelectronic fabrication whose schematic cross-sectional diagram is illustrated in FIG. 6 while employing an aqueous phosphoric acid etchant at elevated temperature.

Figure 7:
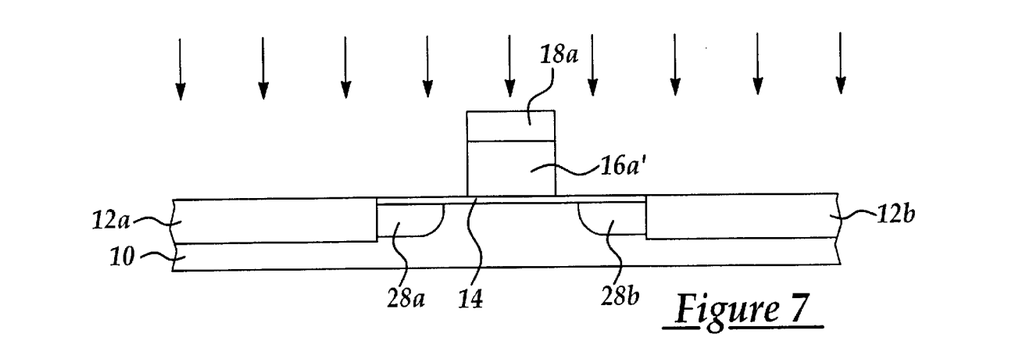

Referring now to FIG. 7, there is shown a schematic cross-sectional diagram illustrating the results of further processing of the semiconductor integrated circuit microelectronic fabrication whose schematic cross-sectional diagram is illustrated in FIG. 6.

Shown in FIG. 7 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 6, but wherein the once patterned gate electrode material layer 16a has again been patterned to form a gate electrode 16a', while employing the patterned auxiliary layer 18a as a mask, in conjunction with a second etching plasma 32.

Within the preferred embodiment of the present invention, the second etching plasma 32 typically and preferably employs methods and materials analogous or equivalent to the methods and materials employed within the first etching plasma 26 as illustrated within FIG. 4 for forming from the blanket gate electrode material layer 16 as illustrated within the schematic cross-sectional diagram of FIG. 3, the once patterned gate electrode material layer 16a as illustrated within the schematic cross-sectional diagram of FIG. 4.

Figure 8:
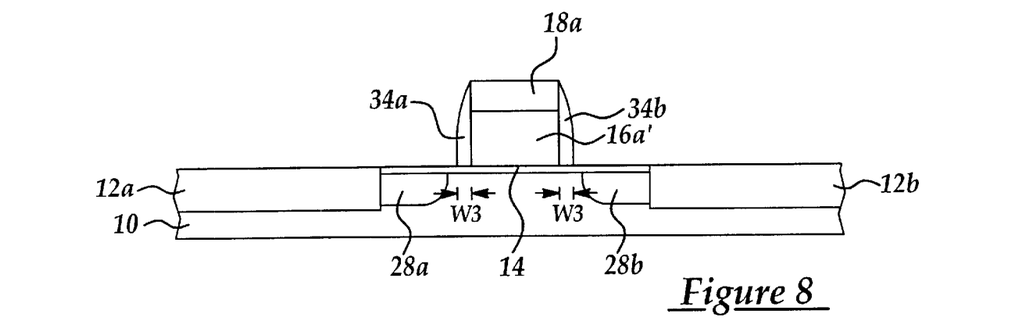

Referring now to FIG. 8, there is shown a schematic cross-sectional diagram illustrating the results of further processing of the semiconductor integrated circuit microelectronic fabrication whose schematic cross-sectional diagram is illustrated in FIG. 7.

Shown in FIG. 8 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 7, but wherein there is formed adjacent and adjoining a pair of sidewalls of the gate electrode 16a' and the patterned auxiliary layer 18a, a pair of permanent spacer layers 34a and 34b.

Within the preferred embodiment of the present invention with respect, to the pair of permanent spacer layers 34a and 34b which may be regarded as a pair of mini-spacer layers, the pair of permanent spacer layers 34a and 34b may be formed employing methods and materials as are conventional in the art of semiconductor integrated circuit microelectronic fabrication, which may include, but are not limited to thermal oxidation methods which provide the pair of permanent spacer layers 34a and 34b formed at least in part of silicon oxide derived from further oxidation of the gate electrode 16a', as well as blanket conformal layer deposition and anisotropic etchback methods as are generally employed for forming the pair of sacrificial spacer layers 24a and 24b as illustrated within the schematic cross-sectional diagram of FIG. 3.

Typically and preferably, the pair of permanent spacers 34a and 34b as illustrated within the schematic cross-sectional diagram of FIG. 8 is formed at least in part of a silicon nitride spacer material or a silicon oxide spacer material, formed such as to have a linewidth W3 adjacent and adjoining the pair of sidewalls of the gate electrode 16a' and the patterned auxiliary layer 18a of from about 0.005 to about 0.01 microns, as illustrated within FIG. 8.

Figure 9:
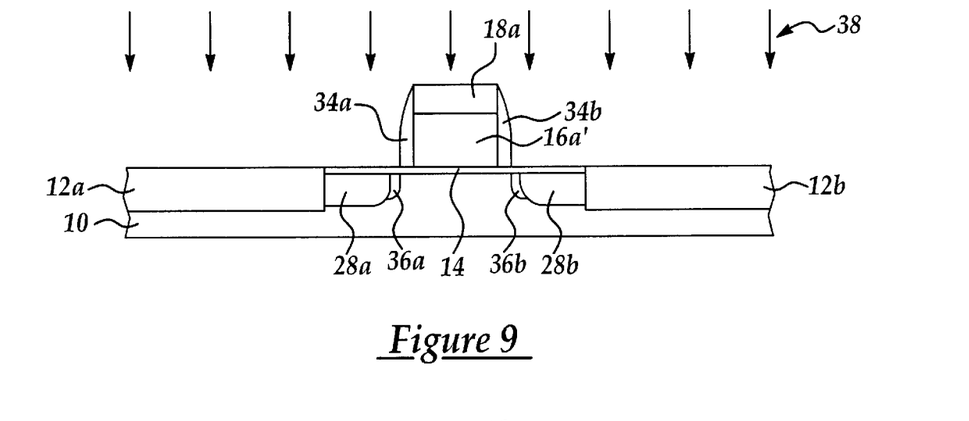

Referring now to FIG. 9, there is shown a schematic cross-sectional diagram illustrating the results of further processing of the semiconductor integrated circuit microelectronic fabrication whose schematic cross-sectional diagram is illustrated in FIG. 8.

Shown in FIG. 9 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 8, but wherein there is formed into the semiconductor substrate interposed between the pair of source/drain regions 28a and 28b and the pair of permanent spacer layers 34a and 34b a pair of lightly doped drain (LDD) extension regions 36a and 36b, while employing the gate electrode 16a', the patterned auxiliary layer 18a and the pair of permanent spacer layers 34a and 34b as a mask, in conjunction with a dose of second implanting ions 38.

Within the preferred embodiment of the present invention, the dose of second implanting ions is typically and preferably of polarity equivalent to the polarity of the dose of first implanting ions 30 as illustrated within the schematic cross-sectional diagram of FIG. 5, but typically and preferably provided at an ion implantation dose of from about 5E13 to about 1E15 dopant ions per square centimeter and an ion implantation energy of from about 2 to about 20 kev by arsenic for NMOS and dose of from 5E13 to 1E15 energy from 2 dev to 10 kev by $BF_2$ for PMOS.

Figure 10:
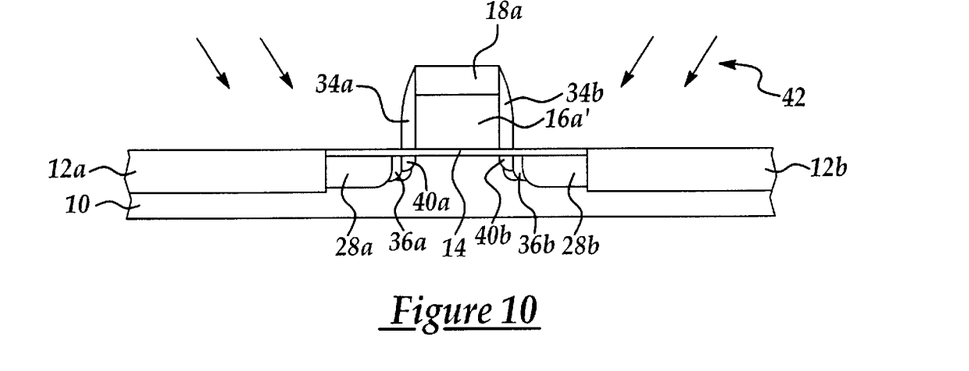

Referring now to FIG. 10, there is shown a schematic cross-sectional diagram illustrating the results of further processing of the semiconductor integrated circuit microelectronic fabrication whose schematic cross-sectional diagram is illustrated in FIG. 9.

Shown in FIG. 10 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 9, but wherein there is formed within the active region of the semiconductor substrate 10 and adjoining the pair of lightly doped drain (LDD) extension regions 36a and 36b and beneath the pair of permanent spacer layers 34a and 34b, while also employing the gate electrode 16a', the patterned auxiliary layer 18a and the pair of permanent spacer layers 34a and 34b as a mask, a pair of pocket extension regions 40a and 40b, in conjunction with a dose of third implanting ions 42 which is provided employing a large angle tilt implant (LATI) method, in comparison with the dose of first implanting ions 30 as illustrated within the schematic cross-sectional diagram of FIG. 5 and the dose of second implanting ions 38 as illustrated within the schematic cross-sectional diagram of FIG. 9, both of which are provided employing a nominally orthogonal (within about +/−7 degrees of normal) ion implant method.

Within the preferred embodiment of the present invention, the dose of third implanting ions 42 is typically and preferably of polarity opposite to the dose of second implanting ions 38 as illustrated within the schematic cross-sectional diagram of FIG. 9 and the dose of first implanting ions as illustrated within the schematic cross-sectional diagram of FIG. 5, but provided at an ion implantation dose of from about 1E13 to about 6E13 dopant ions per square centimeter and an ion implantation energy of from about 50 to about 130 kev, as well as a tilt angle of from about 15 to about 45 degrees from normal.

Upon forming the semiconductor integrated circuit microelectronic fabrication whose schematic cross-sectional diagram is illustrated in FIG. 10, there is formed a semiconductor integrated circuit microelectronic fabrication in accord with the preferred embodiment of the present invention. The semiconductor integrated circuit microelectronic fabrication has formed therein a field effect transistor (FET) device, wherein the field effect transistor (FET) device is fabricated with enhanced structural integrity.

The present invention realizes the foregoing object by employing when fabricating the field effect transistor (FET) device in accord with the present invention a two step etching method for forming from a blanket gate electrode material layer a gate electrode employed within the field effect transistor (FET) device. By employing the two step etching method for forming from the blanket gate electrode material layer the gate electrode employed within the field effect transistor (FET) device, a source/drain region within the field effect transistor (FET) device may be formed prior to forming an additional ion implant structure within the field effect transistor (FET) device (such as but not limited to an additional lightly doped drain (LDD) low dose ion implant structure within the field effect transistor (FET) device or an additional pocket implant structure within the field effect transistor (FET) device), such that the additional ion implant structure which is formed within the field effect transistor (FET) device while employing the gate electrode and a permanent spacer formed adjacent thereto as an ion implant mask need not be exposed to a thermal annealing processing employed for thermal annealing processing of the source/drain region within the field effect transistor (FET) device. Thus, the structural integrity of the additional ion implant structure employed within the field effect transistor is enhanced, and consequently also the performance of the field effect transistor (FET) device is enhanced.

As is understood by a person skilled in the art, the preferred embodiment of the present invention is illustrative of the present invention rather than limiting of the present invention. Revisions and modifications may be made to methods, materials, structures and dimensions employed when fabricating a semiconductor integrated circuit microelectronic fabrication in accord with the preferred embodiment of the present invention while still providing a method for fabricating a field effect transistor (FET) device in accord with the present invention, further in accord with the accompanying claims.

What is claimed is:

1. A method for fabricating a field effect transistor (FET) device comprising:

providing a semiconductor substrate;

forming over the semiconductor substrate a blanket gate electrode material layer;

forming over the blanket gate electrode material layer a patterned auxiliary layer;

forming adjacent a sidewall of the patterned auxiliary layer and also over the blanket gate electrode material layer a sacrificial spacer layer;

etching, while employing at least the patterned auxiliary layer and the sacrificial spacer layer as a mask, the blanket gate electrode material layer to form a once patterned gate electrode material layer;

implanting, while employing at least the once patterned gate electrode material layer as a mask, a source/drain region within the semiconductor substrate;

stripping from adjacent the sidewall of the patterned auxiliary layer the sacrificial spacer layer;

etching, while employing the patterned auxiliary layer but not the sacrificial spacer layer as a mask, the once patterned gate electrode material layer to form a gate electrode;

forming adjacent a sidewall of the gate electrode a permanent spacer layer; and implanting, while employing at least the gate electrode and the permanent spacer layer as a mask, at least one additional ion implant structure within the semiconductor substrate.

2. The method of claim 1 wherein the semiconductor substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

3. The method of claim 1 wherein the field effect transistor (FET) device is selected from the group consisting of metal semiconductor field effect transistor (MESFET) devices and metal oxide semiconductor field effect transistor (MOSFET) devices.

4. The method of claim 1 wherein the blanket gate electrode material layer is formed to a thickness of from about 1000 to about 2500 angstroms.

5. The method of claim 1 wherein the patterned auxiliary layer is formed from a material selected from the group consisting of conductor materials, semiconductor materials and dielectric materials.

6. The method of claim 1 wherein the patterned auxiliary layer is formed to a thickness of from about 400 to about 800 angstroms.

7. The method of claim 1 wherein the patterned auxiliary layer is formed of a linewidth from about 0.1 to about 10 microns.

8. The method of claim 1 wherein the sacrificial spacer layer is formed of a linewidth from about 0.04 to about 0.1 microns.

9. The method of claim 1 wherein the permanent spacer layer is formed of a linewidth from about 0.005 to about 0.01 microns.

10. The method of claim 1 wherein the source/drain region is implanted at an ion implantation dose of from about 3E15 to about 8E15 dopant ions per square centimeter and an ion implantation energy of from about 20 to about 60 kev by arsenic, 10 kev to 20 kev by phosphorus for NMOS, and 5 kev to 10 kev by boron for PMOS.

11. The method of claim 1 wherein the at least one ion implant structure is formed within the semiconductor substrate interposed between the source/drain region and the gate electrode.

12. The method of claim 1 wherein the at least one ion implant structure formed within the semiconductor substrate is selected from the group consisting of lightly doped drain (LDD) extension low dose ion implant structures and pocket extension low dose ion implant structures.

13. The method of claim 1 wherein the at least one ion implant structure includes both a lightly doped drain (LDD) extension low dose ion implant structure and a pocket extension low dose ion implant structure.

14. The method of claim 1 wherein the at least one additional ion implant structure is formed employing a large angle tilt implant (LATI) method.

15. The method of claim 1 wherein the source/drain region is thermally annealed prior to forming the at least one additional ion implant structure.

* * * * *